United States Patent [19]

Tsurusaki

[11] Patent Number: 5,911,356
[45] Date of Patent: Jun. 15, 1999

[54] METHOD FOR ATTACHING LEAD PARTS AND SHIELD CASE TO PRINTED CIRCUIT BOARD, AND METHOD FOR ATTACHING CHIP PARTS, LEAD PARTS AND SHIELD CASE TO PRINTED CIRCUIT BOARD

[75] Inventor: Arata Tsurusaki, Saitama, Japan

[73] Assignee: Sony Corporation, Tokyo, Japan

[21] Appl. No.: 08/911,458

[22] Filed: Aug. 14, 1997

[30] Foreign Application Priority Data

Aug. 19, 1996 [JP] Japan ............................... P08-217557

[51] Int. Cl.$^6$ .................................................. B23K 31/02
[52] U.S. Cl. ...................... 228/136; 228/160; 228/180.1; 228/6.2; 174/35 R
[58] Field of Search ................... 228/180.1, 6.2, 228/160, 136; 174/35 R

[56] References Cited

U.S. PATENT DOCUMENTS

| 4,816,613 | 3/1989 | Ito et al. ............................... 174/35 R |
| 5,160,807 | 11/1992 | Fry et al. .............................. 174/35 R |
| 5,400,949 | 3/1995 | Hirvonen et al. ..................... 228/180.1 |
| 5,581,875 | 12/1996 | Hibino et al. ........................ 228/180.1 |

FOREIGN PATENT DOCUMENTS 63-306698 12/1988 Japan .................................. 174/35 R Primary Examiner—Patrick Ryan
Assistant Examiner—Jeffrey T. Knapp
Attorney, Agent, or Firm—Jay H. Maioli

[57] ABSTRACT

A method of attaching a lead part and a shield case for preventing a high-frequency signal from being leaked to a printed circuit board includes a solder coating step of coating solder so that the solder should cover the whole of an aperture provided through a printed circuit board into which a lead of the lead part is inserted and so that the solder should cover a part of an aperture provided through the printed circuit board into which an engagement portion of the shield case is inserted, a mounting step of inserting the lead of the lead part and the engagement portion of the shield case into the respective apertures to thereby mount the lead part and the shield case on the printed circuit board, and a soldering step of inserting the printed circuit board mounted with the lead part and the shield case into a reflowing furnace and melting the solder to thereby carry out soldering.

12 Claims, 5 Drawing Sheets

FIG. 1G

METHOD FOR ATTACHING LEAD PARTS AND SHIELD CASE TO PRINTED CIRCUIT BOARD, AND METHOD FOR ATTACHING CHIP PARTS, LEAD PARTS AND SHIELD CASE TO PRINTED CIRCUIT BOARD

BACKGROUND

1. Field of the Invention

The present invention relates to a method for attaching a lead part and a shield case to a printed circuit board and a method for attaching a chip part, a lead part and a shield case to a printed circuit board.

2. Background of the Invention

A conventional method for attaching a lead part and its shield case to a printed circuit board and a conventional method for attaching a chip part, a lead part and a shield case to a printed circuit board will next be described with reference to FIGS. 1A to 1J.

A process shown in FIG. 1A will first be explained. Reference numeral 1 designates a printed circuit board. A wiring pattern (not shown) is formed on at least one face (an upper side face in FIG. 1A) of the printed circuit board. A aperture 1h and a slit 1s are formed in this printed circuit board 1. A lead 4L of each of plural lead parts (only one lead part 4 is shown in FIGS. 1A to 1J) 4 described later is inserted into the aperture 1. The printed circuit board 1 is cut and the plural lead parts 4 and chip parts 2 corresponding to these plural lead parts 4 are soldered to the individual printed circuit board 1. One portion of a shield case 5 is fitted into the slit 1s.

A cream solder is printed to one portion of predetermined plural pairs of wiring patterns on the one face of such a printed circuit board 1 by using a soldering printer. Plural chip parts (only one chip part is shown in FIGS. 1A to 1J) 2 is mounted onto each printed cream solder (not shown in the figure) by using a mounting device. The printed circuit board 1 mounting these plural chip parts 2 thereonto is put in a reflow furnace and is heated. The solder is melted and is then cooled. Thus, the plural chip parts 2 are soldered to one portion of the plural pairs of wiring patterns of the printed circuit board 1.

Processes of FIGS. 1B and 1C will next be explained. In the process of FIG. 1B, a solder 3 is coated on one portion of the wiring patterns on one face of the printed circuit board 1 by using a solder coating device in the vicinity of the aperture 1h into which the lead 4L of each of the plural lead parts 4 is inserted. In the process of FIG. 1C, the printed circuit board 1 is reversed such that the one face of the printed circuit board 1 is located on a lower side as shown in FIG. 1C.

In a process of FIG. 1D, the plural lead parts 4 are mounted onto the other face (an upper side face in FIG. 1D) of the printed circuit board 1 such that the lead 4L of each of the plural lead parts 4 is inserted into the aperture 1h of the printed circuit board 1 manually or using a mounting inserting device. Each lead 4L enters the solder 3 on the one face of the printed circuit board 1.

In a process of FIG. 1E, the printed circuit board 1 on which mounted are the plural lead parts 4 is put in the reflow furnace and is heated. Thus, the solder 3 is melted and is then cooled. Thus, the plural lead parts 4 are soldered to one portion of predetermined wiring patterns of the printed circuit board 1 together with the plural chip parts 2.

In a process of FIG. 1F, the printed circuit board 1 is cut and divided by using a substrate divider at each of plural lead parts 4 and chip parts 2 respectively corresponding to these plural lead parts.

In a process of FIG. 1G, a shield case 5 is fitted and attached to an individual printed circuit board 1 to which the lead parts 4 and the chip parts 2 corresponding to these lead parts 4 are respectively soldered.

After the process of FIG. 1G, plural individual assembly blocks each attaching the shield case 5 thereto are positioned at a predetermined position of a carrier and are attached so that the assembly blocks are formed. This process is not shown in FIG. 1G.

In a process of FIG. 1H, a portion of a claw 5N described later as one portion of the shield case 5 of each of the plural individual printed circuit boards 1 on the carrier and one portion of a land constructed by a conductive layer on one face of each of the individual printed circuit boards 1 are respectively coated with solder 6 by using the solder coating device.

In a process of FIG. 1I, the claw 5N of the shield case 5 of each of the plural individual printed circuit boards 1 on the carrier is folded on a side of each of the individual printed circuit boards 5 by using a clincher.

After the process of FIG. 1I, the plural individual assembly blocks are detached from the carrier although this detachment is not illustrated in this figure.

In a process of FIG. 1J, the individual assembly blocks are reversed and are put in the reflow furnace and are heated. Thus, the solder 6 is melted and is then cooled. Thus, it is possible to obtain a circuit block in which the shield case 5 is soldered to each of the individual printed circuit boards 1 having the soldered chip parts 2 and the soldered lead parts 4. In addition to the soldering of the shield case, leads of a through capacitor of a case assembly, connector terminals, etc. are also similarly soldered. For example, this circuit block is a high frequency block formed of a tuner and an intermediate frequency amplifier.

This conventional method for attaching the lead part and its shield case to the printed circuit board has the following drawbacks.

The soldering process of leads of the lead parts to the wiring pattern of the printed circuit board and the shield case thereto using the reflow furnace is a separate process so that the number of processes is increased.

Each of the individual printed circuit boards must be attached to the carrier when a portion between a claw of one portion of the shield case and a land of each of the printed circuit boards is coated with the solder by the solder coating device to solder the shield case to each of the individual printed circuit boards. Further, each of the individual printed circuit boards must be detached from the carrier when each of the printed circuit boards and the shield case are put in the reflow furnace to melt the solder. Accordingly, the number of processes is increased.

When each of the plural individual printed circuit boards attaching the shield case thereto is attached to the carrier and the portion between the claw of one portion of the shield case and the land on a side of the slit 1s of each of the printed circuit boards is coated with the solder by the solder coating device, drawbacks exist in that it is difficult to set attaching and coating conditions and a coating accuracy is low.

A slanting cut nozzle or a special nozzle is required as a nozzle for coating the solder around the shield case in the solder coating device. Accordingly, there is also a drawback of an increase in price of the solder coating device.

A portion between the land of a printed circuit board and the claw of the shield case is coated with the solder by inserting the nozzle for coating the solder into the shield case. Further, portions between the wiring pattern of the printed circuit board and leads of a through capacitor, connector terminals, etc. are coated with the solder such that the leads and the terminals, etc. are inserted into the nozzle. Accordingly, the nozzle may be damaged, etc. Therefore, problems exist in that repair work must be required and a manufacturing line is stopped and so on.

SUMMARY OF THE INVENTION

In view of such aspects, it is an object of the present invention to provide a method for attaching a lead part and a shield case to a printed circuit board and a method for attaching a chip part, a lead part and a shield case to a printed circuit board in which the numbers of processes and works can be reduced in comparison with the conventional attaching method and a solder coating accuracy for soldering the printed circuit board and the shield case can be improved.

According to an aspect of the present invention, a method of attaching a lead part and a shield case for preventing a high-frequency signal from being leaked to a printed circuit board includes a solder coating step of coating solder so that the solder should cover the whole of an aperture provided through a printed circuit board into which a lead of the lead part is inserted and so that the solder should cover a part of an aperture provided through the printed circuit board into which an engagement portion of the shield case is inserted, a mounting step of inserting the lead of the lead part and the engagement portion of the shield case into the respective apertures to thereby mount the lead parts and the shield case on the printed circuit board, and a soldering step of inserting the printed circuit board mounted with the lead part and the shield case into a reflowing furnace and melting the solder to thereby carry out soldering.

In accordance with such a construction of the present invention, the plural lead parts and the plural shield cases are simultaneously soldered to the printed circuit board by the reflow furnace.

The first invention includes a process in which a solder is coated on one portion of a wiring pattern in a vicinity of each aperture of a printed circuit board for inserting each lead of plural lead parts thereinto and on a land formed of a conductive layer in a vicinity of a slit for inserting one portion of each of plural shield cases respectively corresponding to the plural lead parts thereinto; a process in which each lead of the plural lead parts extends through each aperture of the printed circuit board, the one portion of each of the plural shield cases extends through the slit of the printed circuit board so as to surround each of the plural lead parts and the lead parts and the shield cases are mounted onto the printed circuit board; a process in which the printed circuit board mounting the plural lead parts and the plural shield cases thereonto is put in a reflow furnace and the solder is melted and is then cooled, and each lead of the plural lead parts and the one portion of each of the plural shield cases are soldered to the one portion of the wiring pattern of the printed circuit board and to the land; and a process for obtaining plural individual circuit blocks by cutting and dividing the printed circuit board at every set of each of the lead parts and each of the shield cases. Accordingly, in comparison with the conventional attaching method, no carrier is used at a solder coating time prior to reflow. Further, solder coating for soldering the plural lead parts and the plural shield cases to the printed circuit board and solder melting using the reflow furnace are simultaneously performed. Accordingly, the number of processes and works can be reduced. Since no carrier is used, it is possible to obtain an attaching method of a lead part and a shield case to the printed circuit board in which a solder coating accuracy for soldering the printed circuit board and the shield case can be improved. Therefore, the scale of an attaching plant is reduced and a working space can be reduced. Further, since no carrier is used, a nozzle used in the solder coating for soldering the shield case to the printed circuit board can be constructed by a flat nozzle in which an opening is approximately perpendicular to a longitudinal direction of the nozzle. Accordingly, the price of a solder coating device can be reduced.

In accordance with the second invention, a connector is arranged in each of the plural shield cases in the attaching method of a lead part and a shield case to the printed circuit board in the first invention. Further, the plural circuit blocks constructed by the plural lead parts, the plural shield cases and the plural connectors are located at every pair so as to arrange circumferential faces of the respective connectors in proximity to each other, and the pairs of circuit blocks are attached to the printed circuit board so as to arrange the pairs of circuit blocks in a zigzag shape approximately in parallel with each other. Accordingly, effects similar to those in the first invention are obtained. Further, it is possible to obtain an attaching method of a lead part and a shield case to the printed circuit board in which blanking efficiency of the printed circuit board with respect to the circuit blocks constructed by the lead parts, the shield cases and the connectors can be improved.

The third invention includes a process for soldering a chip part to one portion of a wiring pattern of a printed circuit board; a process in which a solder is coated on one portion of a wiring pattern in a vicinity of each aperture of the printed circuit board for inserting each lead of plural lead parts thereinto and on a land made of a conductive layer in a vicinity of a slit for inserting one portion of each of plural shield cases respectively corresponding to the plural lead parts thereinto; a process in which each lead of the plural lead parts extends through each aperture of the printed circuit board, the one portion of each of the plural shield cases extends through the slit of the printed circuit board so as to surround each of the plural lead parts, and the lead parts and the shield cases are mounted onto the printed circuit board; a process in which the printed circuit board mounting the plural lead parts and the plural shield cases thereonto is put in a reflow furnace, the solder is melted and is then cooled, and each lead of the plural lead parts and the one portion of each of the plural shield cases are respectively soldered to the one portion of said wiring pattern of the printed circuit board; and a process for obtaining plural individual circuit blocks by cutting and dividing the printed circuit board at every set of each of the lead parts and each of the shield cases.

Accordingly, in comparison with the conventional attaching method, no carrier is used at a solder coating time prior to reflow. Further, solder coating for soldering the plural lead parts and the plural shield cases to the printed circuit board and solder melting using the reflow furnace are respectively simultaneously performed. Accordingly, the number of processes and works can be reduced. Since no carrier is used, it is possible to obtain an attaching method of a chip part, a lead part and a shield case to the printed circuit board in which a solder coating accuracy for soldering the printed circuit board and the shield cases can be improved. Therefore, the scale of an attaching plant is reduced and a working space can be reduced. Further, since no carrier is used, a nozzle used in the solder coating for soldering the shield case to the printed circuit board can be constructed by a flat nozzle in which an opening is approximately perpendicular to a longitudinal direction of the nozzle. Accordingly, the price of a solder coating device can be reduced.

In accordance with the fourth invention, a connector is provided in each of the plural shield cases in the attaching method of a chip part, a lead part and a shield case to the printed circuit board in the third invention. Further, the plural circuit blocks constructed by the plural chip parts, the plural lead parts, the plural shield cases and the plural connectors are located at every pair so as to arrange circumferential faces of the respective connectors in proximity to each other, and the pairs of circuit blocks are attached to the printed circuit board so as to arrange the pairs of circuit blocks in a zigzag shape approximately in parallel with each other. Accordingly, effects similar to those in the third invention are obtained. Further, it is possible to obtain an attaching method of a chip part, a lead part and a shield case to the printed circuit board in which blanking efficiency of the printed circuit board with respect to the circuit blocks constructed by the chip parts, the lead parts, the shield cases and the connectors can be improved.

BRIEF DESCRIPTION OF THE DRAWINGS

FIGS. 1A to 1J are diagrams used to explain a conventional attaching method;

DESCRIPTION OF THE PREFERRED EMBODIMENT

A method for attaching a lead part and a shield case to a printed circuit board and a method for attaching a chip part, a lead part and a shield case to a printed circuit board according to an embodiment of the present invention will next be described with reference to FIGS. 2A to 2H.

Figure 2A:
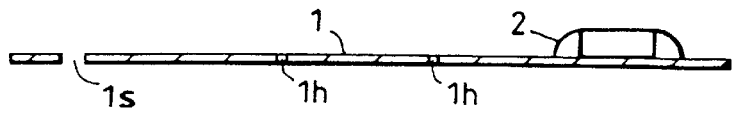
FIGS. 2A to 2H are diagrams used to explain processes according to an embodiment of the present invention.

A process of FIG. 2A will first be explained. Reference numeral 1 designates a printed circuit board. A wiring pattern (not shown) is formed on at least one face (an upper side face in FIG. 2A) of the printed circuit board 1. A aperture 1h and a slit 1s are bored through this printed circuit board 1. A lead 4L of each of plural lead parts (only one lead parts 4 is shown in FIGS. 2A to 2H) 4 described later is inserted into the aperture (each aperture is formed in each of one portion of plural wiring patterns) 1h. One portion of each of plural shield cases 5 respectively corresponding to the plural lead parts 4 and described later is inserted into the slit 1s.

A cream solder is printed to one portion of predetermined plural pairs of wiring patterns on one face of the printed circuit board 1 by using a soldering printer. Plural chip parts 2 (only one chip part 2 is shown in FIGS. 2A to 2H) are mounted onto each printed cream solder (not shown in the figure) by using a mounting device. The printed circuit board 1 mounting these plural chip parts 2 thereonto is put in a reflow furnace and is heated. The solder is melted and is then cooled. Thus, the plural chip parts 2 are soldered to the one portion of the predetermined wiring patterns of the printed circuit board 1.

Figure 1A:
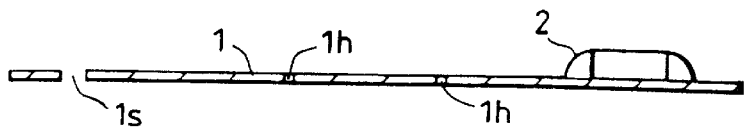
Figure 1B:
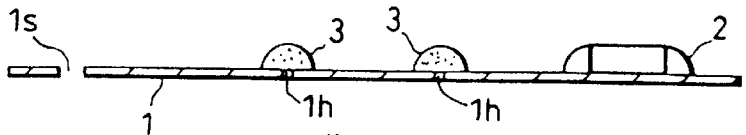
Figure 1C:
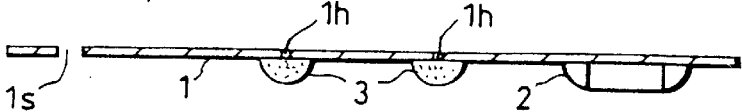
Figure 2B:
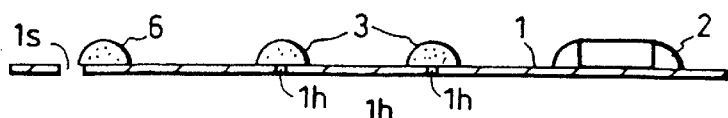
Figure 2C:
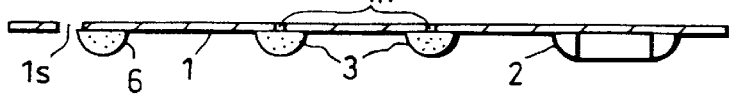
Figure 4A:
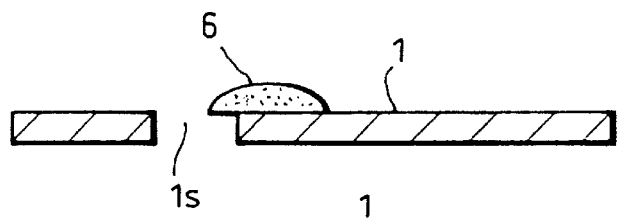
FIGS. 4A to 4F are diagrams showing process each showing one portion of the embodiment in an enlarged scale.
Figure 4B:
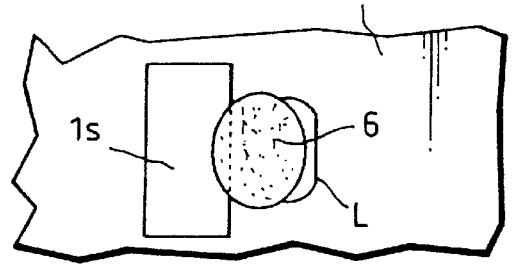
Figure 4C:
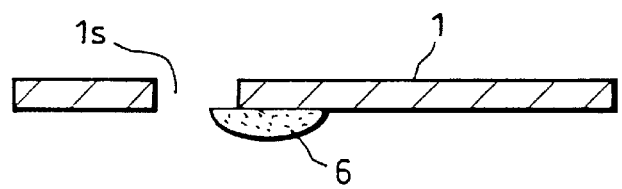

Processes of FIGS. 2B and 2C will next be explained. In the process of FIG. 2B, solders 3 and 6 are respectively coated on a portion of the wiring pattern on one face of the printed circuit board having the aperture 1h into which each of leads of the plural lead parts 4 is inserted, and as shown in FIGS. 4A and 4B, on a land (an island-shaped conductive layer formed on the printed circuit board 1) L (see FIG. 4B) so as to slightly project into the slit 1s on an inner side of the slit 1s for inserting one portion of a shield case 5 thereinto by using a solder coating device. In the process of FIG. 1C, the printed circuit board 1 is reversed such that the one face of the printed circuit board 1 is located on a lower side in this figure (see FIG. 4C).

Figure 1D:
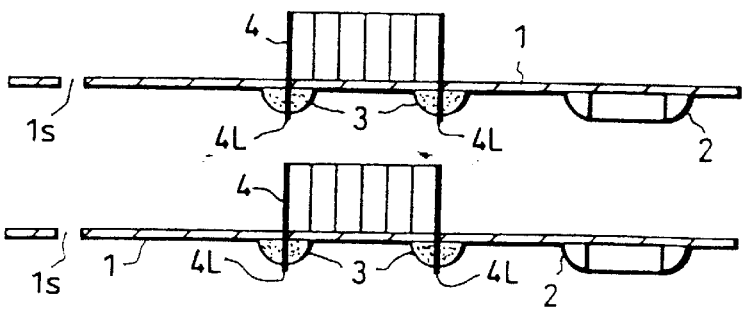
Figure 1E:
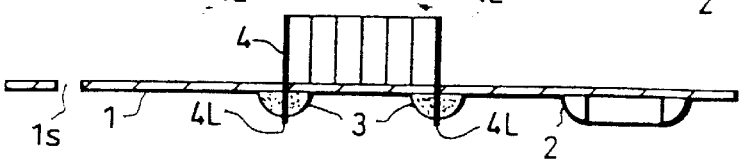
Figure 1F:
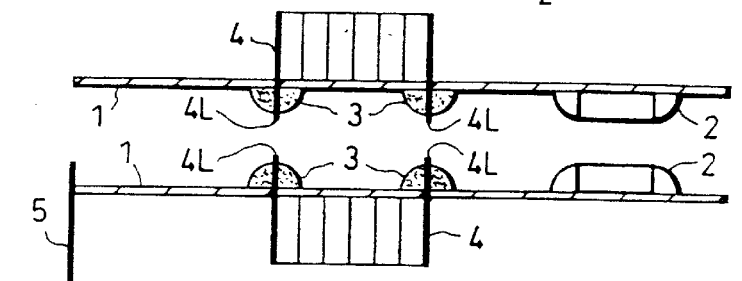
Figure 1H:
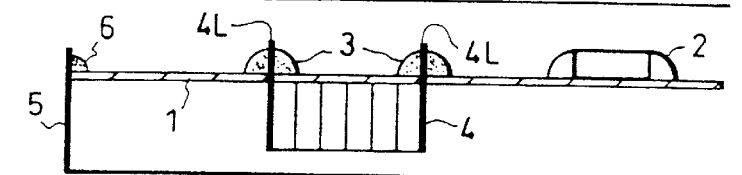
Figure 1I:
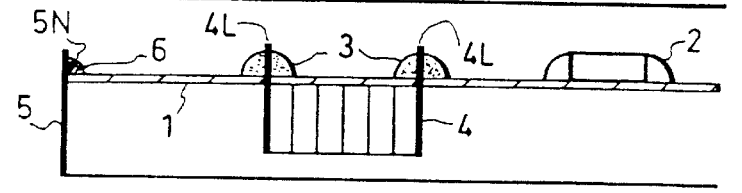
Figure 1J:
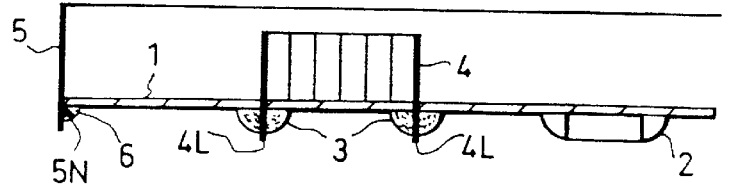
Figure 2D:
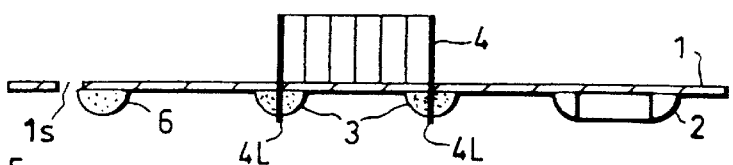

Next, in a process of FIG. 2D, the plural lead parts 4 are mounted onto the other face (an upper side face in FIG. 1D) of the printed circuit board 1 manually or by using a mounting device such that each of the leads 4L of the plural lead parts 4 is inserted into the aperture 1h of the printed circuit board 1. Each of the leads 4L enters the solder 3 on the one face of the printed circuit board 1.

Figure 2E:
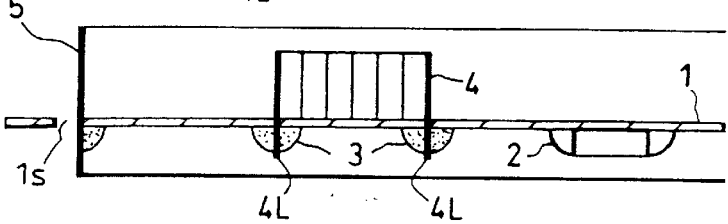

Next, in a process of FIG. 2E, the shield case 5 is fitted into the printed circuit board 1 such that a portion of a claw 5N as one portion of the shield case 5 is inserted into the slit 1s of the printed circuit board 1.

Figure 5:
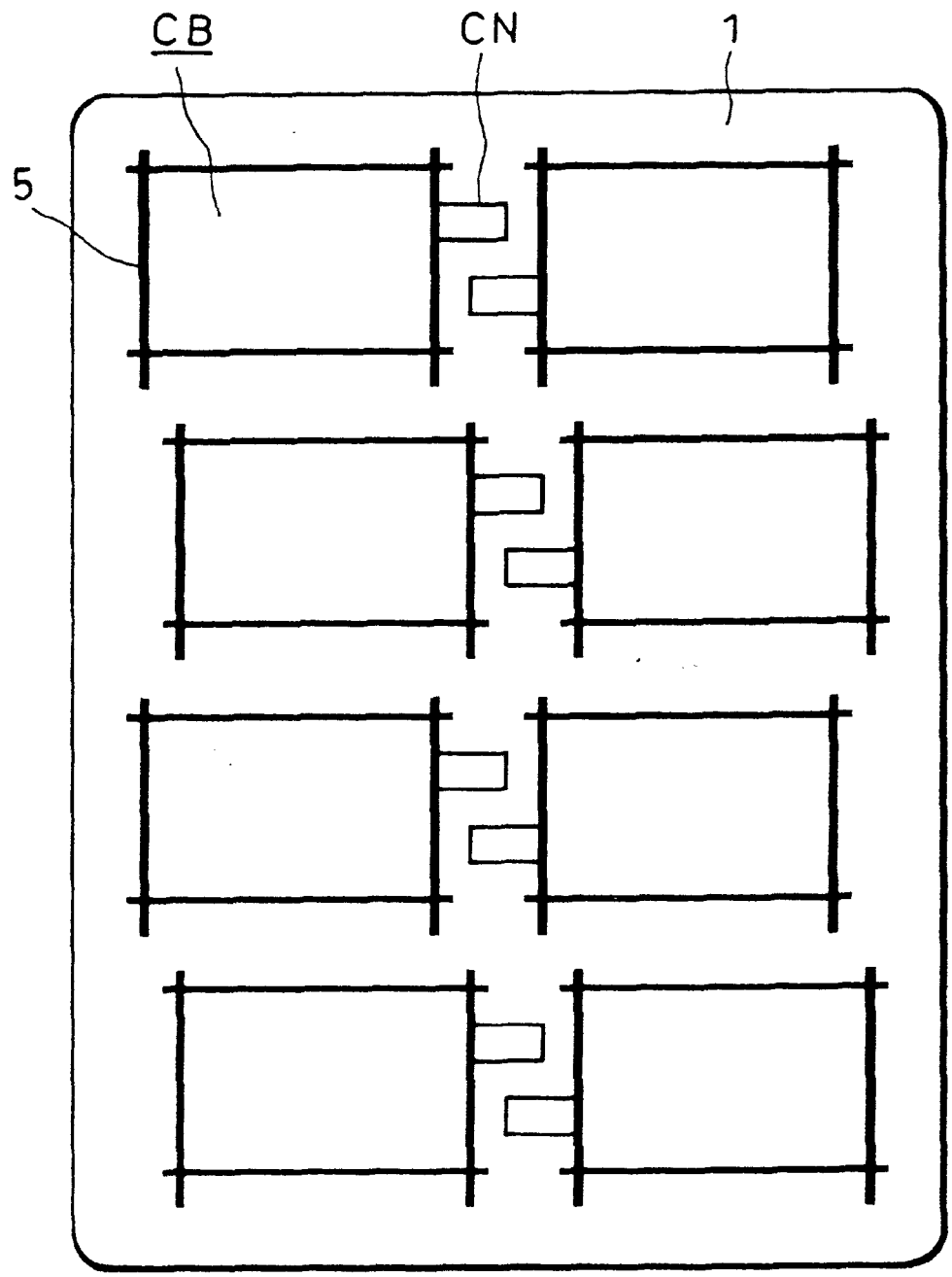
FIG. 5 is a schematic diagram showing a printed circuit board in which circuit blocks in the embodiment are arranged.

As shown in FIG. 5 which shows the printed circuit board 1 seen from the side of the lead parts 4, one pair of shield cases 5 are arranged such that one portions of circumferential faces of respective connectors CN are opposed to each other and four sets of such a pair are arranged in a zigzag shape on one printed circuit board 1. Therefore, blanking efficiency of one printed circuit board 1 is improved and eight shield cases 5 can be attached to this one printed circuit board 1. The distance between slits receiving the shield cases 5 therein on the printed circuit board 1 and corresponding to adjacent corner portions of the adjacent shield cases 5 on the printed circuit board 1 is secured so that the strength of the printed circuit board 1 between the slits 1s increased. In FIG. 5, illustrations of the lead parts 4, the chip parts 2 and a specific shape of the printed circuit board 1 are omitted.

Figure 3A:
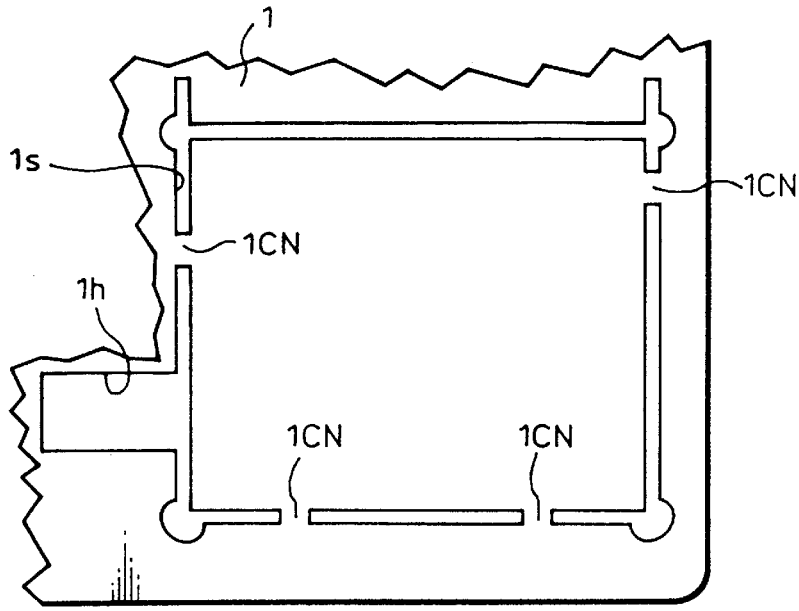
FIG. 3A is a plan view showing a surface of a printed circuit board on which a wiring pattern (not shown) is formed.
Figure 3B:
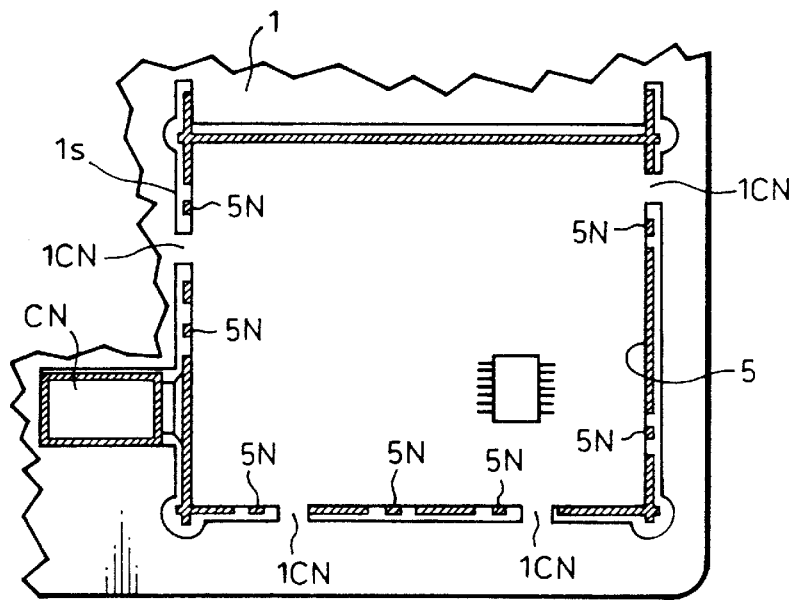
FIG. 3B is a plan view showing the printed circuit board shown in FIG. 3A in a state that a case and a connector are inserted thereinto.
Figure 3C:
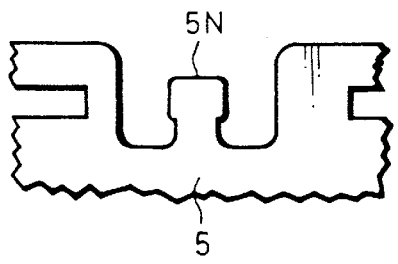
FIGS. 3C and 3D are schematic diagrams showing the shape of a claw of a shield case.
Figure 3D:
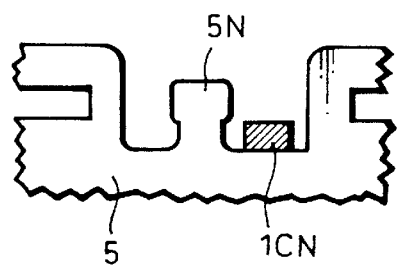
Figure 4D:
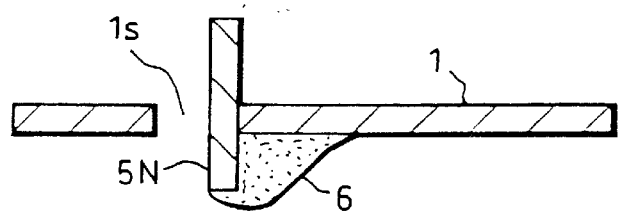
Figure 4E:
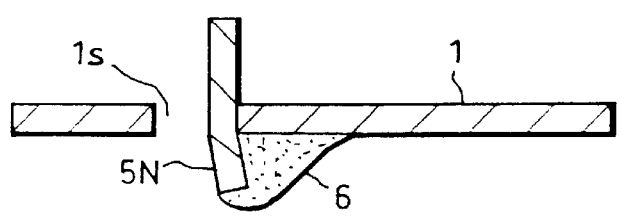

A claw 5N shown in each of FIG. 3C or 3D and FIG. 4D is formed in one portion of the shield case 5 inserted into the slit 1s of the printed circuit board 1. In FIG. 3D, a concave portion into which one portion of the printed circuit board 1, i.e., a connection portion 1CN is inserted is formed on a side of the claw 5N of the shield case 5. In FIG. 3C, this concave portion into which the connection portion 1CN is inserted is not formed. FIG. 3A is a plan view showing a surface of a printed circuit board 1A on which a wiring pattern (not shown) is formed. A substantially rectangular slit 1s into which the shield case 5 is to be inserted is formed through the printed circuit board 1, and the connection portion 1CN of the printed circuit board 1 is formed at a part of the slit 1s. In FIG. 3A, reference numeral 1h depicts an aperture for a connector. FIG. 3B is a plan view showing the printed circuit board 1 in a state that the case 5 is inserted into the slit 1s thereof and the connector CN formed integrally with the case 5 is inserted into the connector aperture 1h. In this embodiment, of the seven claws 5N, four claws 5N have respective concave portions into which the connector portions 1CN shown in FIG. 3D are inserted.

Figure 2F:
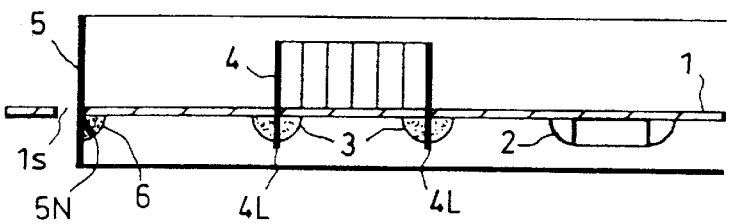

Next, in a process of FIG. 2F, a operable end portion of the claw 5N is bent inside by using a clincher (not shown). This process is omitted when there is no claw 5N in one portion of the shield case 5.

Figure 2G:
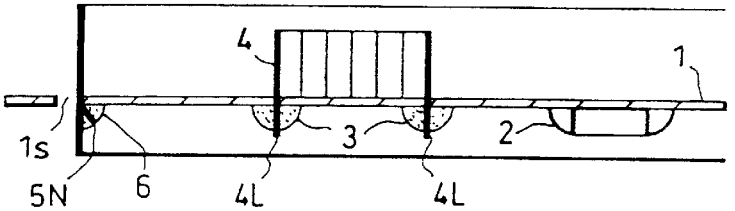

Next, in a process of FIG. 2G, the eight shield cases 5 are attached to the one printed circuit board 1. The printed circuit board 1, in which at least one chip parts 2 and at least one lead part 4 are attached into each of these eight shield cases 5, is put in the reflow furnace and is heated so that the solders 3 and 6 are melted. Thereafter, the solders 3, 6 are cooled. Thus, a portion between each of the leads 4L of the eight lead parts 4 and one portion of each of the wiring patterns of the printed circuit board 1, and a portion between the claw 5N (one portion of the shield case 5 when there is no claw 5N) as one portion of each of the eight shield cases 5 and the land L of the printed circuit board 1 are soldered.

Figure 2H:
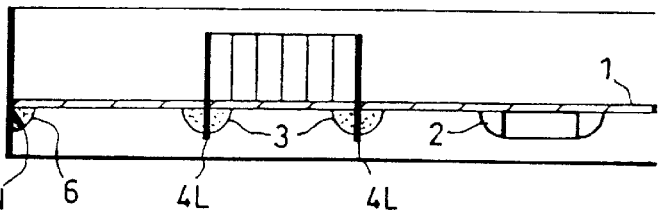
Figure 4F:
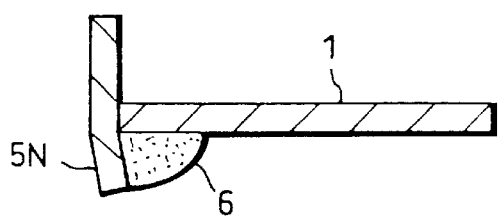

In a process of FIG. 2H, the printed circuit board 1 is cut by a substrate divider in the vicinity of the slit 1s (see FIG. 4F) so that eight circuit blocks each having at least one chip part 2, at least one lead part 4 and the shield case 5 soldered to the individual printed circuit board 1 are obtained. For example, each of these circuit blocks is a high frequency block formed of a tuner and an intermediate frequency amplifier.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. An apparatus for attaching a lead part and a high-frequency leak preventing shield case to a printed board, comprising:

solder coating means for coating solder to cover an entire first aperture provided through a printed circuit board into which a lead of said lead part is to be inserted and to cover a position of a second aperture provided through said printed circuit board into which an engagement portion of said shield case is to be inserted;

mounting means for inserting said lead of said lead part and said engagement portion of said shield case into said respective first and second apertures to thereby mount said lead part and said shield case on said printed circuit board; and a soldering means for inserting said printed circuit board mounted with said lead part and said shield case into a reflowing furnace and melting said solder to thereby carry out soldering.

2. An apparatus for attaching a chip part, a lead part and a high-frequency leak preventing shield case to a printed circuit board, comprising:

chip-part soldering means for soldering the chip part on said printed circuit board;

solder coating means for coating solder to cover an entire first aperture provided through said printed circuit board into which a lead of said lead part is to be inserted and to cover a portion of a second aperture provided through said printed circuit board into which an engagement portion of the shield case is to be inserted;

mounting means for inserting said leads of said lead part and said engagement portion of said shield case into said respective first and second apertures to thereby mount said lead parts and said shield case on said printed circuit board; and a soldering means for inserting said printed circuit board mounted with said lead part and said shield case into a reflowing furnace and melting said solder to thereby carry out soldering.

3. A method of attaching a lead part and a high-frequency leak preventing shield case to a printed circuit board, comprising:

(a) a solder coating step of coating solder to cover an entire first aperture provided through said printed circuit board into which a lead of said lead part is to be inserted and to cover a portion of a second aperture provided through said printed circuit board into which an engagement portion of said shield case is to be inserted;

(b) a mounting step of inserting said lead of said lead part and said engagement portion of said shield case into said respective first and second apertures to thereby mount said lead part and said shield case on said printed circuit board; and (c) a soldering step of inserting said printed circuit board mounted with said lead part and said shield case into a reflowing furnace and melting said solder to thereby carry out soldering.

4. The attaching method according to claim 3, wherein in said mounting step a plurality of sets of lead parts and shield cases are mounted on said printed circuit board and said mounting step further comprises a step of cutting said printed circuit board at each shield case of said plurality of shield cases after said soldering step.

5. The attaching method according to claim 4, wherein each of said plurality of said shield cases is provided with a connector, and said plurality of shield cases are mounted on said printed circuit board alternately arranged so that respective connectors are provided being opposed to one another.

6. The attaching method according to claim 3, wherein in said solder coating step, a claw is provided on the engagement portion of said shield case used for soldering and said solder is coated on said portion of said second aperture formed through said printed circuit board and into which said claw is to be inserted.

7. The attaching method according to claim 6, wherein before said soldering step, a free end portion of said case provided on one end of the engagement portion of said shield case to be inserted into said printed circuit board is bent away from a side of said shield case.

8. A method of attaching a chip part, a lead part and a high-frequency leak preventing shield case to a printed circuit board, comprising:

(a) a chip-part soldering step of soldering the chip part on said printed circuit board;

(b) a solder coating step of coating solder to cover an entire first aperture provided through said printed circuit board into which a lead of said lead part is to be inserted and cover a portion of a second aperture provided through said printed circuit board into which an engagement portion of the shield case is to be inserted;

(c) a mounting step of inserting said lead of said lead part and said engagement portion of said shield case into said respective first and second apertures to thereby mount said lead parts and said shield case on said printed circuit board; and (d) a soldering step of inserting said printed circuit board mounted with said lead part and said shield case into a reflowing furnace and melting said solder to thereby carry out soldering.

9. The attaching method according to claim 8, wherein in said mounting step a plurality of sets of lead parts and shield cases are mounted on said printed circuit board and said mounting step further comprises a step of cutting said printed circuit board at each shield case of said plurality of shield cases after said soldering step.

10. The attaching method according to claim 9, wherein each of said plurality of said shield cases is provided with a connector, and said plurality of shield cases are mounted on said printed circuit board alternatively arranged so that respective connectors are provided being opposed to one another.

11. The attaching method according to claim 8, wherein in said solder coating step, a claw is provided on the engagement portion of said shield case for soldering and said solder is coated on said portion of said second aperture formed through said printed circuit board and into which said claw is to be inserted.

12. The attaching method according to claim 11, wherein before said soldering step, a free end portion of said case provided on one end of the engagement portion of said shield case to be inserted into said printed circuit board is bent away from a side of said shield case.

* * * * *